METHOD FOR FORMING P-N JUNCTIONS ON SEMICONDUCTORS
Filed April 1, 1963
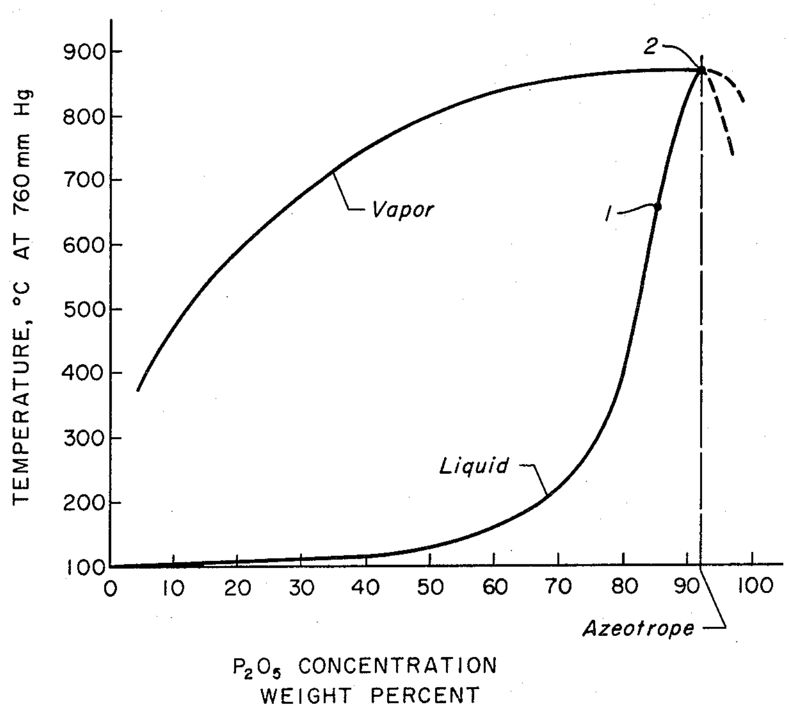
INVENTOR.
ROBERT P. LOTHROP
BY
Roland A. Anderson
ATTORNEY.

United States Patent Office 3,194,701

Patented July 13, 1965

3,194,701
METHOD FOR FORMING P-N JUNCTIONS ON SEMICONDUCTORS

Robert P. Lothrop, San Mateo, Calif., assignor to the United States of America as represented by the United States Atomic Energy Commission Filed Apr. 1, 1963, Ser. No. 269,827
9 Claims. (Cl. 148—189)

The present invention relates to the formation of P-N junction on electrical semiconductor elements and more particularly to a more precise and readily controllable process for forming a phosphorus containing layer at the surface of semiconductors, for creating a P-N junction on a P-type semiconducting material such as silicon or germanium.

This invention is applicable to most usages wherein it is desired to add phosphorus to the surface of a solid, but is of particular interest in the manufacture of semiconductor circuit elements. Many forms of semiconductor elements require a junction layer which is essentially a zone in which an impurity is mixed with the basic semiconductor material to alter the electrical properties thereof.

In general, elemental semiconductors are those elements in column IV of the Mendeleev Periodic Table with an electrical conductivity between that of a conductor and an insulator. Silicon and germanium are the most common semiconductor materials, but others such as the diamond form of carbon, grey tin and other compounds also fall in this classification. In the manufacture of commercial electronic semiconductor devices, a crystal of silicon or germanium is purified by the zone refining method and subsequently a controlled quantity of impurity is added to make the semiconductor P- or N-type conducting. The impurity which is added to the semiconductor is usually a non-transition element and includes those from column III of the Mendeleev Periodic Table to make the semiconductor P-type conducting, or from column V of the periodic table which will make the semiconductor N-type conducting. Elements from column III are called acceptor impurities, and elements from column V are classed as donor impurities.

The silicon or germanium semiconductor blank as produced will be either an N-type or P-type, i.e. the impurities are already added. Therefore to make a simplified P-N junction requires the addition of a P-type impurity to a surface layer of an N-type semiconductor. The present invention is applicable to the case where it is desired to add phosphorus, a donor element from group V, to the semiconductor to form the junction.

In addition to general electronic applications, the P-N junction semiconductor is frequently used as a radiation detector or charged particle detector. A charged particle such as a proton, alpha, or electron releases some of its energy in passing through the P-N junction, and produces an electrical pulse which is amplified and which is proportional to the energy of the particle. In this particular usage, it is extremely important to have a thin uniform P-N junction, which is made possible by the present invention.

One prior method for forming P-N junctions is practiced by producing a vapor carrying a phosphorus compound and subsequently passing such vapor through a furnace containing the semiconductors. Some of the phosphorus compounds used in this process include phosphous pentoxide, phosphorus oxychloride, phosphorus pentaflouride, phosphorus trihydride and phosphous trichloride. However the inherent difficulty with the process, using any of these compounds, is lack of control of the amount of phosphorus deposited on the semiconductor, which imprecision is evidently due to variations in the amount of phosphorus contained in the vapor. Another problem is that the phosphorus compound tends to deposit on the inside walls of the furnace, which leads to further inability to control the process. None of these difficulties are present in this invention. The reliability, performance and appearance of semiconductor junctions formed by the persent invention are a considerable improvement over all previous processes.

It has now been discovered that the use of an azeotropic mixture of phosphorus pentoxide and water in a process of the above described class will give a precisely controlled junction depth in the formation of a P-N junction on a semiconductor. In general, the process of the invention comprises the steps of forming an azeotropic mixture of phosphorus pentoxide and water, vaporizing the mixture and carrying in onto the semiconductor by means of a carrier gas, removing the azeotrope phosphorus source, diffusing the phosphorus into the semiconductor if the required junction depth has not been attained during deposition and, if desired, removing the resultant oxide layer on the outside of the semiconductor by a step such as etcing with hydrofluoric acid. By means of the foregoing process it is possible to control very precisely the amount of phosphorus pentoxide deposited on the surface of a semiconductor since it is possible to control the amount of phosphorus pentxide released to the carrier gas. In particular, the amount of $P_2O_5$ in the carrier gas is controlled by the use of the azeotropic mixture of phosphorus pentoxide-water, which corresponds to a composition at atmospheric pressure (760 mm. Hg) of 92.4 weight percent $P_2O_5$ and 7.6 weight percent $H_2O$. By precisely controlling the amount of phosphorus pentoxide deposited it becomes possible to control the depth of diffusion of phosphorus into the semiconductor. Junction layers as thin 100 angstroms or as thick as 5000 angstroms are readily obtainable.

Accordingly, it is an object of this invention to facilitate the manufacture of semiconductor circuit elements.

It is an object of this invention to provide a process for accurately forming a phosphorus impregnated crystalline surface of controlled depth.

Another object of this invention is to provide a process for the deposition of a controlled amount of phosphorus on a solid surface.

Still another object of this invention is to provide a process for the introduction of a controlled quantity of phosphorus into a semiconductor surface for forming a P-N junction thereon.

A further object of this invention is to provide a new coating process whereby extremely thin P-N junctions may readily be formed on semiconductors.

An additional object of this invention is to provide a source of phosphorus in the process of making a P-N junction on a semiconductor which source permits precision control of the amount of phosphorus entering said semiconductor.

Other objects and advantages of the invention will be apparent from the following description considered together with the accompanying drawing which is a liquid-vapor composition curve at various temperatures for the system phosphorus pentoxide-water, at atmospheric pressure (760 mm. Hg).

Considering now the initial step of the process in greater detail, the azeotrope mixture is formed by adding the stoichiometric amount of water to phosphorus pentoxide to yield the azeotrope. This corresponds to a concentration of 92.4% $P_2O_5$ and 7.6% $H_2O$ at 760 mm. Hg pressure. A simple method for making the azeotrope in practice is by heating metaphosphoric acid, $HPO_3$, in a platinum boat at a temperature of 800° C. for several hours, according to the reaction:

$$2HPO_3 \xrightarrow{800° C.} P_2O_5.H_2O \qquad (1)$$

After heating the mixture at 800° C. for several hours the mixture of $P_2O_5 \cdot H_2O$ will come to equilibrium at the azeotrope point. With reference to the drawing, which is a phosphorus pentoxide-water concentration versus temperature for the liquid and vapor phases, the azeotrope point corresponds to the peak of the liquid and vapor curve which coincide. As an example of obtaining an azeotropic mixture of $P_2O_5$-$H_2O$, consider a mixture at point 1 on the liquid equilibrium curve. If this batch mixture is heated at or below its boiling point, the vapor will contain a higher proportion of water as can be seen from the vapor equilibrium curve. Consequently, the liquid will increase in $P_2O_5$ concentration until the azeotrope point 2 is reached at the peak of the curves. At this point (2) the composition of the liquid and the vapor is the same and equilibrium is attained, the mixture thereby being an azeotrope. The azeotrope mixture is then ready for the phosphorus diffusion on the semiconductors.

Varying pressure will change the azeotrope point, however the process will work equally well at other pressures. For example, the azeotrope point occurs at 91.1% $P_2O_5$ when the pressure is 104 mm. Hg.

The azeotrope mixture, in an open platinum container, is then placed inside a furnace containing the semiconductors, upon which it is desired to deposit a layer of phosphorus for the P-N junctions. A flow of carrier gas, such as nitrogen from a boiling liquid source for example, is then directed over the azeotrope container and subsequently over the semiconductors. Other inert carrier gases that can be used include, but are not limited to, helium, argon and neon. Upon heating of the azeotrope mixture the gas carries a small amount of vaporized azeotrope, some of which is deposited on the surface of the semiconductor. The temperature of the furnace during deposition is maintained well below the melting point of the semiconductor, and below the azeotrope boiling point of 864° C. Above 864 degrees centigrade, the azeotrope mixture will boil and cause spattering of the mixture in the furnace. It is preferred to operate near this temperature however as at lower temperatures less azeotrope will vaporize into the carrier gas, and less $P_2O_5$ will be deposited on the semiconductor in the same length of time.

The length of time the azeotrope mixture is left in the furnace and the temperature of the furnace determines the amount of azeotrope deposited on the semiconductor. The depth of diffusion of the phosphorus into the semiconductor however, is largely determined by the temperature of the furnace. A unique feature of the present invention is the ability to operate at a low furnace temperature, such as 600° C. which yields a very shallow diffusion depth, of the order of 100 angstroms when the diffusion time is minimized.

Typical reaction times fall within the range of from about one hour to sixteen hours according to such factors as the desired depth of the N-layer. The reaction of the phosphorus pentoxide and water with the semiconductor goes according to the following reactions:

$$2P_2O_5+5X \rightarrow 4P+5XO_2 \qquad (2)$$

$$2H_2O+X \rightarrow 2H_2+XO_2 \qquad (3)$$

Where X is the semiconductor, typically germanium or silicon. The reaction of Equation 2 proceeds quite rapidly, and the reaction of Equation 3 proceeds somewhat slower. The elemental phosphorus formed by the reaction of Equation 2 produces the P-N junction.

When a sufficient amount of phosphorus pentoxide has deposited on the surface of the semiconductor, the azeotrope container is removed from the furnace. The temperature of the furnace can then be raised if desired for an increased depth of diffusion of the elemental phosphorus into the semiconductor. The depth of penetration of the phosphorus into the semiconductor is also proportional to the square root of the time of diffusion and thus the thickness of the junction may be regulated by appropriate control of these conditions.

Following the diffusion step, the semiconductors are cooled within the furnace and subsequently removed therefrom. The surface to be used as a P-N junction is masked, and the semiconductor is etched in a suitable solution such as a solution of 25% hydrofluoric acid in water. This etching process removes the thin hydrophilic oxide layer formed by the reaction of Equations 2 and 3.

The amount of phosphorus diffused into the semiconductor by the foregoing process can be very precisely controlled since the azeotrope mixture of phosphorus pentoxide in water provides a unique source of phosphorus with an invariant composition and a vapor pressure controllable by furnace temperature. The process gives highly reproducible results which are particularly valuable at the low temperature required for such specialized operations as the production of silicon radiation detectors having very shallow N-layers.

For a further understanding of the invention, reference will now be made to an actual example of the formation of a P-N junction on P-type silicon.

A thin wafer of P-type silicon of 1500 ohm-cm. resistivity, approximately 20 mils. thick, was sliced from a bar of commercial semiconductor grade silicon. The wafer was then lapped with alumina, and subsequently etched in a solution of three parts nitric acid to one part hydrofluoric acid. The wafer was then washed in a 25% solution of hydrofluoric acid in water in order to remove any surface $SiO_2$. An electrically heated furnace was adapted to receive a flow of 0.5 liter per minute of cold nitrogen gas with the gas exiting to a fume hood, the flow of nitrogen being controlled with a valve. The temperature of the furnace was raised to 800° C. The silicon wafer was placed in the furnace, and a pure platinum boat containing the azeotropic mixture of phosphorus pentoxide and water was placed in the furnace upstream from the wafer, relative to the flow of nitrogen gas. The phosphorus pentoxide was allowed to deposit on the surface of the semiconductor for a period of 60 minutes. At the end of this time, the platinum boat containing the azeotrope mixture was withdrawn from the furnace. The temperature of the furnace was raised to 900° centigrade for a period of 30 minutes. This formed a diffusion depth of 5000 angstrom units, which corresponds to sheet resistivity of 30 ohms per square using a four point probe. The furnace was then allowed to cool until a temperature of 550° C. was reached. The wafer was then removed from the furnace and cooled and masked with an acid resistant tape. The wafer was then etched in a hydrofluoric acid-nitric acid mixture. The base contact area was formed by vapor phase deposition of gold and pressure point contacts were added to the unetched area to make a standard diode.

As a further example of the practice of the invention, a wafer formed of 1500 ohm-cm. P-type silicon was treated in the same furnace arrangement as described above. The phosphorus pentoxide was allowed to deposit on the semiconductor for a period of 16 hours at a furnace temperature of 600° C., after which heating was terminated and the wafers were cooled. The sheet resistivity of the wafer was found to be 4500 ohms per square which corresponds to a diffusion depth of approximately 300 angstroms.

It will be apparent to those skilled in the art that numerous variations and modifications are possible within the spirit and scope of the invention, and thus it is not intended to limit the invention except as defined in the following claims.

What is claimed is:

1. In a process for forming a P-N junction on the surface of a semiconductor with phosphorus, the step comprising exposing said surface to an azeotropic mixture of gaseous phosphorus pentoxide and water vapor for a controlled period of time.

2. In a process for treating a semiconductor element to form a P-N junction thereon, the steps comprising heating said semiconductor element, heating an azeotropic mixture of gaseous phosphorus pentoxide and water, directing the vapor from said heated azeotrope to a surface of said semiconductor, and maintaining said surface of said semiconductor at an elevated temperature for a limited period of time to control the depth of diffusion of phosphorus into said surface.

3. A process as described in claim 2 wherein said azeotropic mixture and said semiconductor are maintained at a temperature below about 864° C.

4. In a process for forming a P-N junction in a semiconductor, the steps comprising, heating said semiconductor, introducing an azeotropic mixture of gaseous phosphorus pentoxide and water vapor into a flow of an inert carrier gas, and directing said flow to a surface of said semiconductor to deposit phosphorus thereon.

5. In a process for forming a P-N junction on a semiconductor, the steps comprising, heating said semiconductor, generating a heated azeotropic mixture of gaseous phosphorus pentoxide and water vapor intermixing said gaseous azeotropic mixture with a flow of inert carrier gas, directing said flow to a surface of said heated semiconductor for a controlled period of time, and maintaining said semiconductor at an elevated temperature for a controlled period of time to regulate the depth of diffusion of phosphorus into said surface.

6. The process as claimed in claim 5 wherein the inert carrier gas is one of a group consisting of nitrogen, helium, argon and neon.

7. In a process for forming a P-N junction on a plurality of semiconductor elements, the steps comprising, heating said semiconductor elements in a furnace, generating an azeotropic mixture of gaseous phosphorus pentoxide and water vapor in said furnace by heating a liquid mixture of phosphorus pentoxide and water therein, generating an inert carrier gas flow within said furnace which passes said liquid mixture to take up said gaseous azeotropic mixture therefrom and subsequently passes a surface of said semiconductors, to deposit phosphorus pentoxide thereon.

8. The process as described in claim 7, wherein said liquid mixture is removed from said furnace prior to the termination of heating of said semiconductors therein whereby the diffusion of phosphorus into said surface is continued for an interval after the termination of the deposition of phosphorus thereon.

9. In a process for forming P-N junctions on a plurality of semi-conductor elements, the steps comprising, disposing said semiconductors in a furnace having a temperature below about 864° C., heating a liquid azeotrope of phosphorus pentoxide and water to form an azeotropic mixture of gaseous phosphorus pentoxide and water vapor in said furnace, passing nitrogen carrier gas past said liquid azeotropic source and subsequently past said semiconductors within said furnace for a controlled period of time, removing the source of said azeotrope from said furnace, and subsequently maintaining the furnace at a high temperature for an additional controlled period of time to promote diffusion of deposited phosphorus into the surface of said semiconductors to form said P-N junctions thereon.

References Cited by the Examiner

UNITED STATES PATENTS

| | | | |
|---|---|---|---|
| 2,802,760 | 8/57 | Derick | 148—189 |
| 2,804,405 | 8/57 | Derick | 148—189 |
| 2,873,222 | 2/59 | Derick | 148—189 |
| 2,974,073 | 3/61 | Armstrong | 148—189 |
| 3,066,052 | 11/62 | Howard | 148—188 |

OTHER REFERENCES

Hackh's Chemical Dictionary, The Blakiston Co., Philadelphia, 3rd Ed. 1944, p. 90.

Kittsley: Physical Chemistry, Barnes and Noble, Inc., New York, 1957, pp. 66 and 67.

BENJAMIN HENKIN, *Primary Examiner.*